United States Patent [19]
Ragle et al.

[11] Patent Number: 4,782,222
[45] Date of Patent: Nov. 1, 1988

[54] BULK AVALANCHE SEMICONDUCTOR SWITCH USING PARTIAL LIGHT PENETRATION AND INDUCING FIELD COMPRESSION

[75] Inventors: Larry O. Ragle, Palo Alto; Stephen J. Davis, San Francisco, both of Calif.

[73] Assignee: Power Spectra

[21] Appl. No.: 92,487

[22] Filed: Sep. 3, 1987

[51] Int. Cl.$^4$ .............................................. H01J 40/14
[52] U.S. Cl. ................................................ 250/211 J
[58] Field of Search ......................... 250/211 R, 211 J

[56] References Cited

U.S. PATENT DOCUMENTS

| | | | |
|---|---|---|---|
| 4,218,618 | 8/1980 | Mourou | 250/211 J |
| 4,301,362 | 11/1981 | Mourou | 250/211 J |
| 4,347,437 | 8/1982 | Mourou | 250/211 R |
| 4,438,331 | 3/1984 | Davis | 250/211 J |

*Primary Examiner*—David C. Nelms
*Assistant Examiner*—Khaled Shami
*Attorney, Agent, or Firm*—Townsend & Townsend

[57] ABSTRACT

A switch using an improved method of optically-triggered avalanche breakdown which can produce pulses of 100 picoseconds duration that can deliver five kilovolts into 50 ohms using a standard laser diode. A semiconductor block is provided with contacts on opposing sides across which a high-voltage less than the avalanche breakdown voltage is applied. The semiconductor block is then irradiated with electromagnetic radiation. The wavelength of the radiation and the absorption co-efficient of the semiconductor block are chosen so that the absorption depth of the majority of the radiation is less than the distance between the contacts. This results in a photoconduction area where absorption occurs, thus applying most of the high voltage across the distance beyond the photoconduction area. This provides field compression and generates an avalanche breakdown field across the remaining distance of the semiconductor block. Fast switching of large currents is obtained through the dual use of photoconduction as a trigger and subsequent avalanche conduction.

38 Claims, 4 Drawing Sheets

BULK AVALANCHE SEMICONDUCTOR SWITCH USING PARTIAL LIGHT PENETRATION AND INDUCING FIELD COMPRESSION

A related application is entitled "Bulk Avalanche Semiconductor Switch Using a Mesa Structure," Ser. No. 07/92,745, filed concurrently herewith.

BACKGROUND

The present invention relates to the switching of electric power through avalanche action throughout the volume of a block of semiconductor material.

One method of switching electrical current is to provide two contacts to a block of semiconductor material. The semiconductor material is doped so that it acts as an insulator. When light from a laser is directed on the semiconductor material, photoconduction occurs which causes the semiconductor block to conduct. Typically, a powerful desk top laser is required to generate the required amount of photoconduction for significant amounts of current. A discussion of switches of this type is contained in U.S. Pat. No. 4,438,331 to Davis. Davis shows a switch which can be triggered with a laser diode.

An alternate method using avalanche breakdown is discussed in U.S. Pat. No. 4,347,437 to Mourou. Mourou applies a high voltage across the semiconductor material which is less than the voltage which would cause avalanche breakdown. Avalanche breakdown occurs when the charge carriers (i.e., electrons and holes) have sufficient kinetic energy due to the applied field so that when they collide with an atom they knock loose one electron/hole pair which in turn create further electron/hold pairs, thereby creating an exponentially increasing current flow. Mourou uses the high voltage to bias the semiconductor material below the voltage required for avalanche breakdown. A laser is then used to generate "seed" carriers which initiate the avalanche process. This builds to full avalanche conduction over a period of a few hundred picoseconds to more than one nanosecond.

Although Mourou does not set forth the details of the avalanche breakdown, it is believed the avalanche in his device proceeds with the creation of one or more "streamers" of conduction through the semiconductor material between the contacts, with the streamers increasing in diameter until the entire semiconductor is conducting. A streamer is a thin line of conduction between the contacts which may start at microscopic irregularities of the contact or the semiconductor material. The creation of such streamers would limit the useful life of the switches because of the high stress placed on the areas in which the streamers first occur.

The Mourou device requires that the semiconductor material is cooled to a cryogenic temperature to prevent thermally-induced carriers from starting conduction when the voltage is applied and before the laser is turned on. Mourou states that a laser diode with 3 nanojoules produces a megawatt of power using this method.

SUMMARY OF THE IVENTION

The present invention is a switch using an improved method of optically-triggered avalanche breakdown which can produce pulses of 100 picoseconds duration or more and that can deliver five kilovolts or more into 50 ohms with a rise time of substantially 50 picoseconds or less using a standard laser diode. A semiconductor block is provided with contacts on opposing sides across which a high-voltage less than the instantaneous avalanche breakdown voltage is applied. The semiconductor block is then irradiated with electromagnetic radiation. The wavelength of the radiation and the absorption depth coefficient of the semiconductor block are chosen so that the absorption depth of the majority of the radiation is less than the distance between the contacts. After triggering, this results in a photoconduction area where absorption occurs and where photogenerated hole-electron pairs are created, thus shifting most of the high voltage across the distance beyond where the radiation is absorbed. This provides significant field "compression" or enhancement and generates an avalanche breakdown field across the remaining distance of the semiconductor block.

The photoconductive avalanche semiconductor switch (PASS) device of the present invention is a light activated switch which is designed to operate in a mixed photoconductive-avalanche mode. A semiconductor diode injection laser is used to generate a sufficient light flux to create a photoconductive region with a electron-hole density of substantially $10^{16}/cm^3$ or more near the surface from which the light enters. The wavelength of light used to create this photoconductive region is chosen such that the light absorption depth is some major fraction of the interelectrode spacing. Immediately after creation of this photoconductive region, the electric field in the PASS device is intensified near the electrode which is located on the opposite side from where the light enters. Avalanche carrier generation will ensue after approximately one nanosecond or less if the electric field and background carrier levels in this avalanche region are sufficiently high. Typically, the field value must be on the order of $2 \times 10^5$ volts/cm or higher for strong avalanche generation to occur.

The PASS device differs importantly in design as well as in operation from the purely avalanche device described by Gerard Mourou in U.S. Pat. No. 4,347,347. The principal design differences reside in the laser drive wavelength and intensity chosen. The PASS device utilizes a drive with a wavelength chosen (typically 0.7 to 0.9 microns for gallium arsenide) to give an absorption depth substantially less than the interelectrode spacing, whereas in the avalanche device the wavelength (typically 1.06 to 10 microns for gallium arsenide) is chosen to penetrate quite uniformly throughout the device between the two electrodes. In addition, the PASS device uses a laser intensity and pulse length sufficient to give a strongly photoconductive region in the body of the device, whereas in the avalanche device the opposite is true. In the Mourou patent, carriers are implanted or seeded only to trigger avalanche conduction through the bulk of the body between the electrodes and the laser triggering energy level is much less than that needed for photoconduction through the body.

Operationally, the PASS device of the present invention uses photoconduction in one region and avalanche generation in a second region to create the electron-hole pairs. The two regions are electrically in a series connection with relation to each other. The creation of these two regions is separated in time by about one nanosecond. In contrast, in a pure avalanche device there is but a single avalanche region created throughout the body at a single time.

In general, the PASS device may switch with a lower level of triggering light flux (which, however, is concentrated in one region) and at a lower applied bias voltage than a device which is designed to operate solely in an avalanche mode. In addition, the PASS device may switch more quickly and with less jitter than a switch which has been designed to operate solely in the avalanche mode.

The field compression effect results in a high, relatively uniform field and uniform photogeneration of "seed" carriers in the avalanche region, thus minimizing or eliminating streamers. The device has a turn-on rise time of approximately 50 picoseconds, due to the nature of the avalanche process. In addition the lifetime of the device is much greater than the devices of the prior art. The field compression and avalanche mechanism permit the device to be triggered to the ON state with a conventional injection laser diode. Also, a high resistivity or semi-insulating semiconductor block can be used, thus eliminating the need for cryogenic cooling and allowing the device to operate at room temperature. The block itself is preferably made of semi-insulating gallium arsenide (GaAs).

In one embodiment, to achieve higher avalanche rates with a semi-insulating semiconductor (which allows room temperature operation) a second laser is used with a wavelength such that the radiation is absorbed throughout the semiconductor block. This second laser is used to generate the necessary "seed" charge carriers more or less independently of the first laser which is used to produce field compression. In this embodiment, the first and second lasers can irradiate the semiconductor block from the same side or from opposite sides.

In another embodiment, two lasers are used to produce field compression, one on each side of the semiconductor block. Each laser has a wavelength such that its radiation is absorbed within a distance less than half the distance through the semiconductor block. Thus, there still remains a semi-insulating region with only a small "seed" charge carrier density between the photoconduction regions for the two lasers. Field compression is achieved across this semi-insulating region, causing avalanche breakdown between the two photoconduction regions. This enables lower power lasers to be used since each laser does not have to penetrate as far. Alternately, different wavelength lasers could be used with one side penetrating further than the other.

In addition, an array or arrays of lasers could be used on one side or both sides, rather than a single laser, to reduce the size of the individual laser diodes needed. The light from the laser can be carried to the semiconductor block through the use of an optic fiber.

In another embodiment, a capacitance of small value (i.e. 0.5 to 50 pf for a 0.16 mm$^2$ central active area of the semiconductor block) is added in parallel across the PASS device to increase the final level of avalanche multiplication, which will occur after triggering, in the avalanche region of the device. The effect of such a parallel capacitance is to maintain the electric field across the PASS device avalanche region for a longer time than would be possible in the absence of such a capacitance. By maintaining the field at a high level for a longer time, more avalanche ionization is generated (a higher density of electron-hole pairs) and a more highly conductive "ON" state of the PASS device is achieved.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
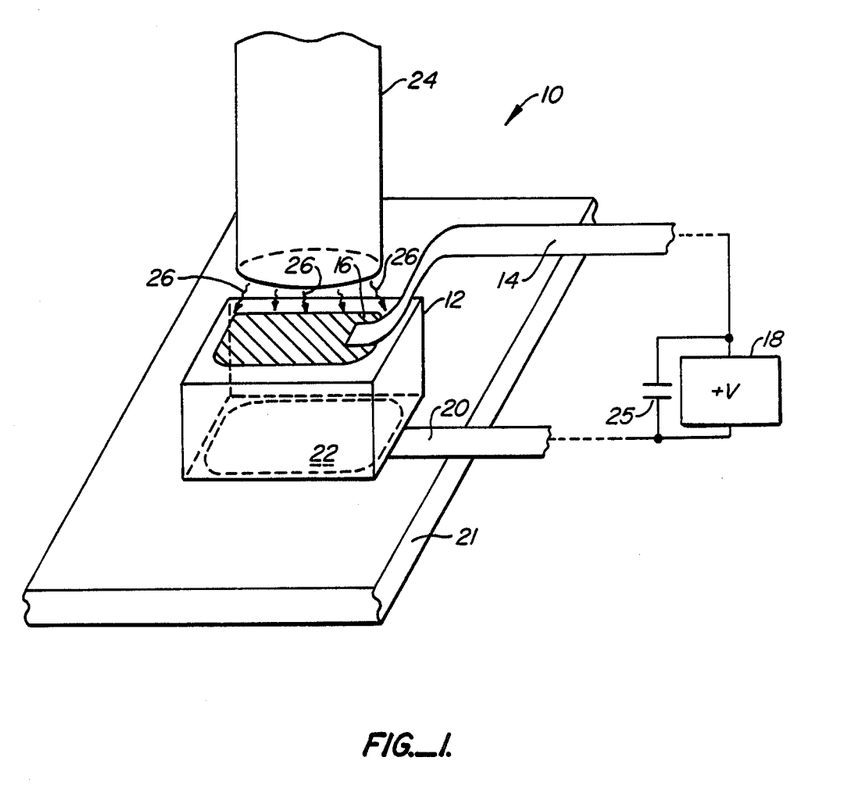
FIG. 1 is a perspective view of a switch according to the present invention.

FIG. 1 is a perspective view of a PASS bulk switch 10 according to the present invention. A block 12 of semiconductor material, preferably N-type GaAs is provided with a top metal electrode 16 and a bottom metal electrode 22 (shown in phantom). Electrodes 16 and 22 are connected by conducting lines 14 and 20, respectively, to a high voltage power supply 18. Block 12 is optionally mounted on a substrate 21 (such as beryllia) which acts as a heat sink. An optical fiber 24 directs light rays 26 onto the top of block 12.

Figure 2:
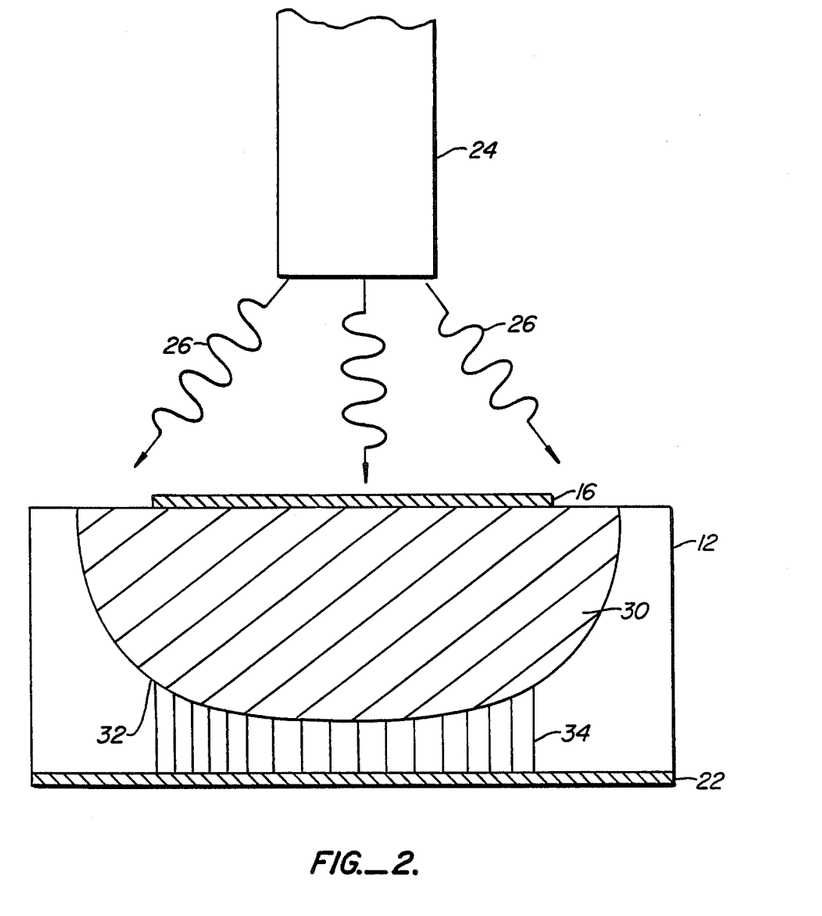
FIG. 2 is a cross-sectional diagram of a switch according to the present invention showing the field compression effect and an optically transparent first electrode.

The operating mechanism of switch 10 can be seen from the cross-sectional diagram of FIG. 2. A high voltage is applied across electrodes 16 and 22 to present an electric field across block 12 which is less than the instantaneous avalanche breakdown value. Light from a laser diode (not shown) is passed through a fiber-optic cable 24 and directed as indicated by light rays 26 onto the top of block 12. This light will be absorbed in a region 30 to create hole-electron pairs and a region of photoconduction which is less than the distance between electrodes 16 and 22. Electrode 16 on the top of the block 12 is formed from a "transparent" conductor such as tin oxide or indium oxide, a maximum of several microns thick. This might allow more uniform conduction in the active area of the semiconductor block.

Region 30 will have photo-generated charge carriers which act to effectively place the bias voltage across a bottom edge 32 of photoconduction region 30 and electrode 22, rather than across electrodes 16 and 22. This shorter distance makes the electric field created by the same bias voltage high enough to cause avalanche breakdown which causes a conduction plasma 34 to conduct between the charge carriers of photoconduction region 30 and electrode 22.

A PASS device preferably operates with as little light input flux as necessary to achieve the desired level of conductivity in the "ON" state, so that the laser diode drive requirements can be as modest as possible. A device with approximately a 0.16 mm$^2$ "active" area and in which the spacing between electrodes is 0.5 mm and with a 5,000V bias requires a light flux of about 20 to 200 nj for high conductivity in the "ON" state. One way to reduce the light flux needed is to increase the bias voltage across the PASS device with a given interelectrode spacing. This higher bias voltage results in a higher field within the device. Since a smaller volume of the PASS device needs to be made photoconductive to achieve a given field level in the avalanche region after the laser trigger pulse illuminates the device, larger initial bias voltages are highly desirable.

A capacitor 25 is added in parallel in one embodiment to increase the final level of avalanche multiplication by maintaining the electric field for a longer time. The capacitance can be obtained in one of several ways. In a first embodiment a small capacitor can be added externally and discretely to the device. This capacitor can be ceramic or mylar, for example. Preferably an external capacitor will be located physically in close proximity to the PASS device to minimize spurious inductance in the capacitor leads. The capacitor could have an annular shape or be square with a square hole in the center, for example, so that it could be placed to surround and connect to the PASS chip with ribbon or an annular washer structure to minimize stray inductance. In a second embodiment the capacitor can be integral to the PASS device and comprised of first and second electrodes extended in area and a larger overall chip.

Avalanche triggering will occur when the following approximate expression reaches a sufficiently large value:

$$G = a_1 NE \exp(-a_2/E^{a_3}) \qquad \text{eq. 1}$$

where G is avalanche generation rate, E is electric field strength, N is charge carrier density and $a_1$, $a_2$, and $a_3$ are constants peculiar to a given material. Avalanche generation then occurs when the photo-generated carrier density and the electric field strength are sufficiently high.

When the photon energy $h\nu_T$ is made approximately equal to the energy gap $E_g$ of the semiconductor block, the photon absorption depth is made less than, but a substantial fraction of, the thickness of the semiconductor block. Alternatively, one can vary the gap energy $E_g$ to obtain, within limits, a desired effective absorption length for a fixed photon energy, by applying stress to or changing the temperature of the block. Generally, an increase in temperature or application of uniaxial compression should decrease the gap energy. As $E_g$ decreases relative to $h\nu_T$, the absorption depth also decreases. In addition, the wavelength of the laser diode can be varied by controlling the temperature of the laser diode.

Figure 6:
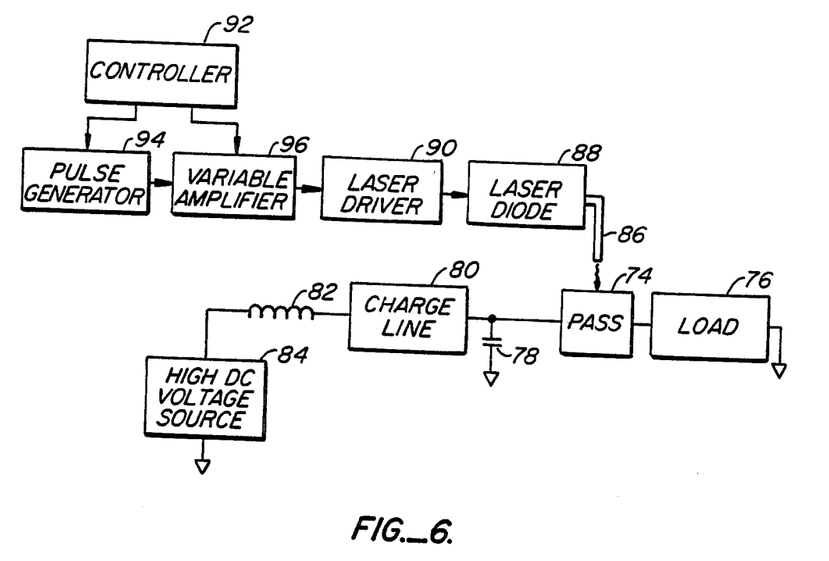
FIG. 6 is a diagram of a circuit for controlling the switch of FIG. 1.

The turn-off of the PASS device will often be accomplished by means external to the PASS itself, such as by the use of pulse forming network drive lines, such as shown in FIG. 6. In some applications it is convenient to employ self turn-off of the PASS device. For rapid self turn-off, it is necessary that the recombination time be rapid since the self turn-off time will be that of the recombination time in the absence of latch-up. Latch-up is avoided in general by making the recombination time short relative to the charge carrier transit time. The transit time is defined as the time required for charge carriers to traverse the interelectrode spacing.

During the self-turn-off time the electron-hole pairs will recombine, taking away the charge carriers which are necessary for conduction. To promote rapid turn-off of the PASS device, the semiconductor semi-insulating or lightly doped N region can be doped with trapping levels. An example is the doping of semi-insulating gallium arsenide with chromium or oxygen to a density of at least $10^{15}/cm^3$.

The intensity I (or photon flux) of monochromatic light at a given depth d is given by the equation:

$$I = I_0 e^{-\alpha d} \qquad \text{eq. 2}$$

where:
 $\alpha$ = absorption coefficient of semiconductor;
 d = depth;
 I = intensity at d; and
 $I_0$ = initial intensity.

One can tell by looking at equation 2 that if the intensity of the light source is reduced or if the absorption coefficient is increased, the intensity at a particular depth will decrease and thus the depth of conduction region 30 will decrease. Since the absorption depth of a semiconductor material decreases with the wavelength of the light, a smaller absorption depth requires shorter wavelengths. One method for allowing the use of longer wavelength light or for using lower intensity (i.e., lower power) lasers is shown in FIG. 3.

Figure 3:
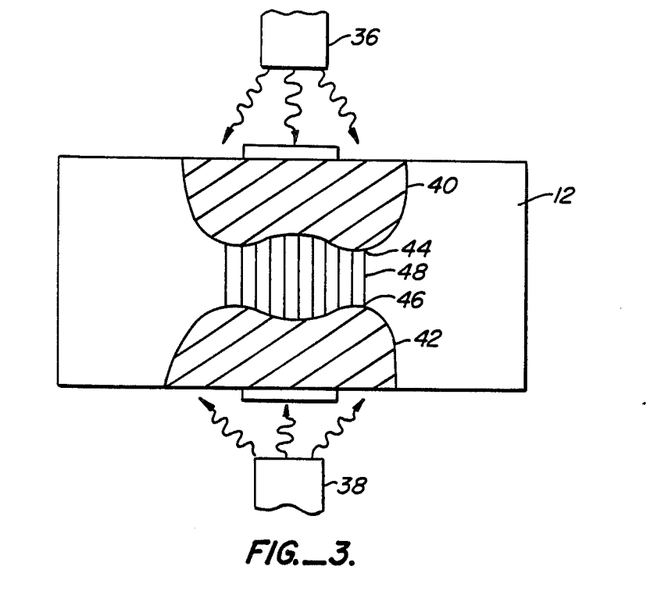
FIG. 3 is a cross-sectional diagram of a switch according to the present invention showing the field compression effect of illumination from both sides.

In FIG. 3, two fiber-optic cables 36, 38 from two different laser diodes (not shown) direct light at two sides of semiconductor block 12, creating two absorption regions 40 and 42, respectively. Field compression then occurs between the bottom edge 44 of region 40 and the top edge 46 of region 42 to give an avalanche region 48. Thus, for the same thickness of semiconductor block 12, two laser diodes of lower power or the same power and shorter wavelength can be used to produce the same effect as that of FIG. 2. This method is useful where very high voltages (around 40 kV or higher) are switched and a thick block is needed to hold off the voltage.

Figure 4:
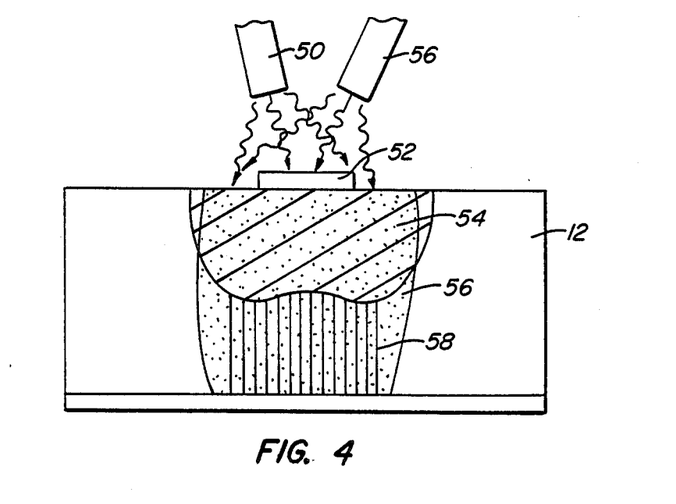
FIG. 4 is a cross-sectional diagram of a switch according to the present invention with a second laser producing light absorbed throughout the block.

One way to improve the switching sensitivity (switched current times switched voltage divided by radiation energy received) of this method is shown in FIG. 4. A first fiber-optic cable 50 directs a laser beam at a top surface of a mesa 52 to create an absorption region of photo-generated carriers 54. A second fiber-optic cable 56 directs light having a wavelength sufficient to be absorbed throughout the width of semiconductor block 12 to give a region 56 of photo-generated carriers. Region 56 provides sufficient "seed" electron and hole carriers to initiate avalanche breakdown at a lower light flux from the laser beam associated with the first fiber-optic cable 50 than would otherwise be possible.

Preferably, block 12 is N-type or P-type or semi-insulating GaAs having a resistivity greater than $10^6$ ohm-cm to allow room temperature operation without thermal carriers causing thermal runaway. With a 5 kV bias and a 1 mm diameter area, this resistivity results in a leakage of less than 400 mW. The voltage applied across the electrodes of a block of width 0.5 mm can be up to 5 kV or higher. Although this is one preferred embodiment, a range of choices of wavelength, doping concentration, voltages, etc. will work.

The top and bottom electrodes each provide ohmic contacts, with a static or time-varying electrical field of the order of E=20,000–200,000 kV/cm being imposed between the two electrodes. At a predetermined time, a trigger pulse $h\nu_T$ of electromagnetic radiation of wavelength $\lambda_T = c/\nu_T \sim 860$–910 nm (nanometers) propagates toward block 12, is partially transmitted into and through the block, and initiates electrical breakdown by avalanche in the bulk or volume of the block. A current then flows between the two electrodes.

In the case of III-V or II-V semiconductor materials, the associated trigger pulse energy $h\nu_T$ is preferably chosen to be approximately equal to the lowest bandgap energy $E_g$ associated with an *actual* valence-conduction transition for an electron. This choice should provide the most efficient absorption of photons from the laser while allowing an adequate energy difference to provide a large number of available conduction band transition sites. If the energy $h\nu_T$ is chosen too close to the actual energy bandgap $E_g$, the Pauli exclusion principle will severely limit the number of transition states available. Other energy levels, such as those from trapping levels, may exist to assist the photoelectron-hole creation process, and will alter the absorption depth coefficient, and therefore, the choice of wavelength.

The GaAs material should preferably have a resistivity $10^6$ ohm-centimeters or higher. For examples, such material is available from M/A-COM, Gallium Arsenide Products, Inc. or Spectrum Technology, Inc. in Czochralski-grown, semi-insulating blocks. Orientation of the GaAs crystal is also important, because the electron ionization rate is significantly higher perpendicular to a (100) plane than it is perpendicular to a (111) plane. High electron ionization rates produce higher switching sensitivity (switched current times switched voltage divided by radiation energy received).

Other semiconductor materials may be used rather than GaAs, and this choice will affect the irradiation wavelength $\lambda_T$ used for illumination. Some attractive choices of high mobility semiconductor material are shown in Table I.

TABLE I

| Semiconductor Materials & Mobilities. | |
|---|---|
| Material | Mobility (cm$^2$/volt-sec) |
| C | 1,800 |
| GaAs$_{1-x}$P$_x$ | |
| CdTe | 1,050 |
| GaAs | 8,500 |
| InP | 4,600 |
| Si | 1,500 |
| GaSb | 5,000 |
| Ge | 3,600 |
| InAs | 30,000 |
| ImP$_x$As$_{1-x}$ | |
| InSb | 80,000 |
| PbTe | 6,000 |
| PbSe | 1,000 |

For rapidly pulsed, repetitive operation or long pulse lengths, one may provide a heat sink material contiguous to the semiconductor block in any of the embodiments of the invention, to efficiently carry away the heat produced by dissipation of energy within the block. The heat sink material may be a substantially solid block of a high thermal conductivity material such as beryllia, copper, aluminum, tungsten, titanium, molybdenum or diamond; or it may be a liquid such as a fluorocarbon that is in contact with and flowing past one or more surfaces of the semiconductor block.

For the illumination source, for example, one may use a 500 watt laser diode array, such as is available from Laser Diode, Model 391, or as a single 15 watt laser diode, Laser Diode Model MH67, with output fed by optical fibers or rods or other means of delivery to the GaAs block. Due to the dielectric mismatch of GaAs and air, in the absence of anti-reflection coatings only about 70 percent of the radiation incident upon the GaAs surface is transmitted; the remaining 30 percent is reflected. Therefore, the use of anti-reflection coatings adjacent to the irradiated GaAs surface(s) may be appropriate to increase the absorption of the initiating radiation.

Figure 5:
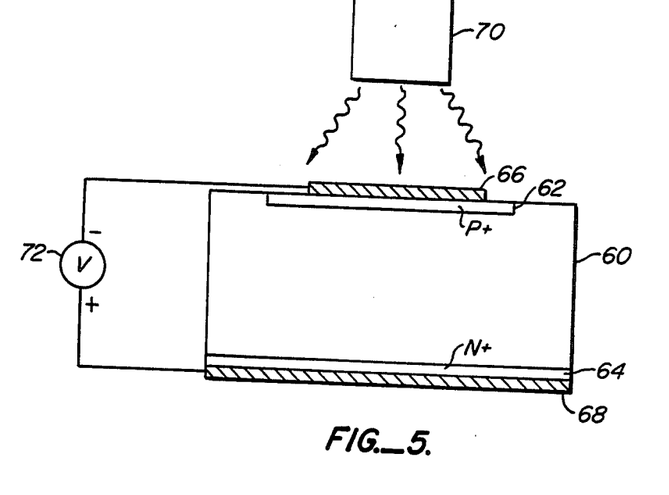
FIG. 5 is a cross-section diagram showing a PIN structure according to the present invention.

FIG. 5 shows an alternate embodiment of a switch using a PIN structure. A GaAs block 60 of insulating material is covered with a layer of P+ material 62 on the top and a layer of N+ material 64 on the bottom. These are in turn covered by electrodes 66 and 68, respectively. Light from a fiber optic cable 70 is provided in the manner shown for previous embodiments. N+ layer 64 prevents metal migration from contact 68 into the block 60 as discussed in co-pending application Ser. No. 07/92,745. The embodiment of FIG. 5 uses a P+ region 62 rather than N+ region and applies a voltage from a voltage source 72 so that the positive end of the voltage is applied to electrode 68 and the negative end is applied to electrode 66. By applying the positive voltage to the N+ region, electrons which would otherwise diffuse into the lowly doped or I region, are prevented from doing this by the attraction of the positive voltage. Conversely, the negative voltage applied to electrode 66 attracts the holes from P+ region 62 which would migrate into block 60. If an N+ region were used instead of P+ region 62, it would not be possible to stop this electron diffusion from the negatively biased N+ region.

The P+/I/N+ embodiment of FIG. 5 allows a higher voltage to be applied by eliminating the gradient of electrons which would otherwise be injected from one of the N+ regions into the I region. The effect of this gradient would be to cause the avalanche region to avalanche at a somewhat lesser field than would otherwise be the case, since the injected electrons act as "seed" carriers. Avalanche generation is caused by fields in excess of approximately $2 \times 10^5$/cm and is enhanced by a background or "seed" carrier density of electrons or electron-hole pairs. The higher voltage possible is desirable because this results in a higher rate of generation of electron-hole pairs in the avalanche region after triggering and therefore a higher ON state conductivity. Conversely, a higher voltage allows the use of a lower light flux for triggering for a given "ON" state conductivity.

FIG. 6 is a diagram of a circuit for controlling a switch 74 of the present invention. A load 76 is shown connected between the switch and ground. A capacitor 78 is coupled across a switch in the same manner as discussed earlier for FIG. 1. A charge line 80 and an inductor 82 are used to couple a high DC voltage source 84 to the switch. The charge line permits fast turn-off of the switch and the inductor presents a high impedance for high frequencies to give a fast rise time for a pulse through the switch.

Switch 74 is activated by light from a fiber optic cable 86 generated by a laser diode 88. Laser diode 88 is driven by a laser driver 90. A controller 92 initiates a pulse from a pulse generator 94 which can then be amplified in a variable amplifier 96.

The amplitude of the pulses through switch 74 can be varied or modulated by the circuit of FIG. 6. By controlling variable amplifier 96, the intensity of the laser light projected onto switch 74 is varied and thus the absorption depth if varied. By varying the absorption depth, the resistance of a switch can be controlled and thus the current can be varied for a fixed DC voltage. Alternately, this modulation could be done by using a series of lasers of different wavelengths with each wavelength penetrating to a different distance to provide different absorption depth. The modulation could then be done by coupling the appropriate laser for the modulation value desired to fiber optic cable 86.

As will be understood by those familiar with the art, the present invention may be embodied in other specific forms without departing from the spirit or essential characteristics thereof. For example, the electrodes could be coupled to the sides of block 12 with the light being directed at the middle to produce two narrow compressed fields adjacent each electrode. Alternately, electrodes may be attached on the sides on one side of the block a distance apart. Accordingly, the disclosure of the preferred embodiments of the present invention is intended to be illustrative, but not limiting, of the scope of the invention which is set forth in the following claims.

What is claimed is:

1. A method for switching current comprising the steps of:
    providing a semiconductor block having conducting contacts coupled to said block a predetermined distance apart;
    applying a high voltage across said contacts; and
    irradiating said block with electromagnetic radiation from a source of radiation having a predetermined wavelength such that a majority of said radiation penetrates the portion of said block between said contacts less than said distance to generate charge carriers and to cause sufficient field compression of said voltage to give avalanche conduction over a portion of said block.

2. The method of claim 1 wherein said contacts are provided on opposing surfaces of said block.

3. The method of claim 1 wherein said radiation is monochromatic and said semiconductor is composed of a material having an absorption constant for the wavelength of said monochromatic radiation such that a majority of said radiation is absorbed in less than said distance between said contacts.

4. The method of claim 3 further comprising the step of irradiating said block with electromagnetic radiation having a second wavelength such that a substantial portion of said radiation is absorbed throughout said distance.

5. The method of claim 1 wherein substantially all of said radiation is absorbed in less than said distance.

6. The method of claim 1 further comprising the step of irradiating said semiconductor block with a second source of electromagnetic radiation on a side opposite said first-mentioned source such that the total penetration depth of substantially all of the radiation from said first and second sources is less than said distance.

7. The method of claim 1 wherein said high voltage is greater than one-tenth the D.C. avalanche breakdown voltage for said semiconductor block across said distance and less than three times said D.C. avalanche breakdown voltage.

8. The method of claim 1 wherein said step of applying a high voltage comprises applying a high voltage pulse beginning immediately prior to said irradiating step and continuing for at least a portion of the time of said irradiating step.

9. The method of claim 1 further comprising the step of providing a capacitor in parallel with said semiconductor block.

10. The method of claim 1 further comprising the step of modulating one of the intensity and wavelength of said electromagnetic radiation.

11. The method of claim 1 further comprising the step of providing trapping levels in said semiconductor block.

12. A method for switching current comprising the steps of:
    providing a semiconductor block with a predetermined absorption coefficient for a predetermined wavelength of electromagnetic radiation having conducting contacts coupled to top and bottom surfaces of said block separated by a predetermined distance;
    applying a high voltage across said contacts, said voltage being less than three times the D.C. avalanche breakdown voltage for said semiconductor block across said distance and greater than one-tenth said avalanche breakdown voltage; and
    irradiating said top surface of said semiconductor block with monochromatic electromagnetic radiation having said wavelength such that substantially all of said radiation will be absorbed by said semiconductor block in less than said distance to generate charge carriers causing sufficient field compression for avalanche conduction.

13. The method of claim 12 wherein said irradiating step uses a laser diode and further comprising the step of varying the temperature of said laser diode to give a said wavelength.

14. A semiconductor switch comprising:
    a block of semiconductor material;
    a first conductor coupled to said block;
    a second conductor coupled to said block a predetermined distance from said first conductor;
    power supply means for providing a high voltage across said conductors; and
    means for irradiating said block with electromagnetic radiation having a predetermined wavelength such that the majority of said radiation penetrates through said block between said contacts less than said distance.

15. The switch of claim 14 wherein said first conductor is coupled to a top surface of said block and said second conductor is coupled to a bottom surface of said block.

16. The switch of claim 14 wherein said means for irradiating is at least one laser diode.

17. The switch of claim 16 further comprising a fiber optic cable coupling said laser diode to said block.

18. The switch of claim 14 wherein said radiation is monochromatic.

19. The switch of claim 18 further comprising a second source of monochromatic radiation having a wavelength such that radiation from said second source penetrates throughout said distance.

20. The switch of claim 14 wherein said first-mentioned means for irradiating directs radiation at a top surface of said block and further comprising a second source of electromagnetic radiation for directing radiation at a bottom surface of said block such that substantially all of the radiation from said first means and said second source is absorbed in a total depth less than said distance.

21. The switch of claim 14 further comprising a block of heat sink material contiguous with said second conductor.

22. The switch of claim 21 wherein said heat sink material is drawn from the class consisting of beryllia, copper, aluminum, tungsten, titanium, molybdenum and diamond.

23. The switch of claim 21 wherein said heat sink material is a heat sink liquid such as a fluorocarbon.

24. The switch of claim 14 wherein said power supply means is chosen to produce a pulse voltage waveform.

25. The switch of claim 14 wherein said means for irradiating produces one or more pulses of irradiation.

26. The switch of claim 14 further comprising a layer of P+ semiconductor material between said first conductor and said block and a layer of N+ semiconductor material between said second conductor and said block.

27. The switch of claim 26 wherein a positive terminal of said power supply means is coupled to said second conductor and a negative terminal of said power supply means is coupled to said first conductor.

28. The switch of claim 14 further comprising a capacitor coupled in parallel with said block.

29. The switch of claim 14 further comprising means for modulating said means for irradiating to vary one of the intensity and wavelength of said electromagnetic radiation.

30. The switch of claim 14 wherein said block is gallium arsenide.

31. The switch of claim 30 wherein said block is doped to be N-type or P-type with a resistivity greater than $10^6$ ohm-cm.

32. The switch of claim 14 further comprising a charge line coupled between said block and said power supply means.

33. The switch of claim 14 wherein said block is doped with trapping levels.

34. The switch of claim 33 wherein said trapping levels are one of chromium or oxygen with a density of at least $10^{15}/cm^3$.

35. The switch of claim 14 wherein at least one of said first and second conductors is substantially transparent.

36. The switch of claim 35 wherein said transparent conductor is one of tin oxide and indium oxide.

37. A semiconductor switch comprising:
a block of semiconductor material;
a first conductor coupled to said block;
a layer of P+ semiconductor material between said first conductor and said block;
a second conductor coupled to said block a predetermined distance from said first conductor;
a layer of N+ semiconductor material between said second conductor and said block;
power supply means for providing a high voltage across said conductors with a positive terminal coupled to said second conductor and a negative terminal coupled to said first conductor; and
means for irradiating said block with electromagnetic radiation having a predetermined wavelength such that the majority of said radiation penetrates through said block between said contacts less than said distance.

38. The switch of claim 37 wherein said distance is at least 5 micrometers.

* * * * *